(12) United States Patent
Nakiboglu et al.

(10) Patent No.: US 10,345,717 B2
(45) Date of Patent: Jul. 9, 2019

(54) LITHOGRAPHIC APPARATUS AND METHOD

(71) Applicant: ASML Netherlands B.V., Veldhoven (NL)

(72) Inventors: Günes Nakiboglu, Eindhoven (NL); Suzanne Johanna Antonetta Geertruda Cosijns, Casteren (NL); Anne Willemijn Bertine Quist, Eindhoven (NL); Lukasz Sosniak, Diepenbeek (NL); Frank Johannes Jacobus Van Boxtel, Eindhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/959,115

(22) Filed: Apr. 20, 2018

(65) Prior Publication Data
US 2018/0239258 A1    Aug. 23, 2018

Related U.S. Application Data

(63) Continuation of application No. 15/502,466, filed as application No. PCT/EP2015/064389 on Jun. 25, 2015, now Pat. No. 9,977,348.

(30) Foreign Application Priority Data

Aug. 15, 2014 (EP) .................................... 14181162

(51) Int. Cl.
*G03F 7/20* (2006.01)
(52) U.S. Cl.
CPC ............ *G03F 7/7085* (2013.01); *G03F 7/709* (2013.01); *G03F 7/70775* (2013.01)

(58) Field of Classification Search
CPC .......................... G03F 7/70775; G03F 7/7085
(Continued)

(56) References Cited

U.S. PATENT DOCUMENTS

| 6,731,378 | B2 | 5/2004 | Hibbs |
| 7,253,875 | B1* | 8/2007 | Luttikhuis ........... G03F 7/70775 355/30 |
| 7,492,441 | B2 | 2/2009 | Van Empel |
| 2001/0006422 | A1 | 7/2001 | Fukagawa et al. |
| 2007/0146656 | A1 | 6/2007 | Van Empel |

(Continued)

FOREIGN PATENT DOCUMENTS

| JP | H02-1505 | 1/1990 |
| JP | H08261718 | 10/1996 |

(Continued)

OTHER PUBLICATIONS

International Search Report and Written Opinion dated Sep. 25, 2015 in corresponding International Patent Application No. PCT/EP2015/064389.

(Continued)

*Primary Examiner* — Hung Nguyen
(74) *Attorney, Agent, or Firm* — Pillsbury Winthrop Shaw Pittman LLP

(57) ABSTRACT

A lithographic apparatus includes an optical sensor, a movable body, a support, a deflector system, a first drive system and a second drive system. The movable body is moveable relative to the sensor. The support is for holding the sensor. The first drive system is arranged to move the movable body relative to the sensor. The second drive system is arranged to move the first drive system relative to the sensor. The second drive system is arranged to move the deflector system relative to the sensor. A disturbance is induced by a movement of the movable body. The deflector system is arranged to create a deflecting area for reflecting the disturbance away from the support.

23 Claims, 6 Drawing Sheets

(58) Field of Classification Search
 USPC ........................................ 355/30, 53, 72–76
 See application file for complete search history.

(56) References Cited

U.S. PATENT DOCUMENTS

| | | | |
|---|---|---|---|
| 2008/0088843 | A1 | 4/2008 | Shibazaki |
| 2011/0008717 | A1* | 1/2011 | Ichinose ............ G03F 7/70691 |
| | | | 430/30 |
| 2011/0164238 | A1* | 7/2011 | Yoshimoto .......... G03F 7/70341 |
| | | | 355/72 |
| 2012/0026721 | A1 | 2/2012 | Kurt et al. |
| 2012/0268721 | A1* | 10/2012 | Yang ................... G03F 7/70425 |
| | | | 355/67 |
| 2013/0177857 | A1 | 7/2013 | Shibazaki |
| 2013/0183623 | A1 | 7/2013 | Shibazaki |

FOREIGN PATENT DOCUMENTS

| | | |
|---|---|---|
| JP | H10-294272 | 11/1998 |
| JP | H11-3854 | 1/1999 |
| JP | 2001-160531 | 6/2001 |
| JP | 2007251156 | 9/2007 |
| JP | 2010-040719 | 2/2010 |
| JP | 2010219558 | 9/2010 |
| JP | 2012531029 | 12/2012 |
| JP | 2013-506972 | 2/2013 |
| JP | 2013513224 | 4/2013 |
| WO | 2014/044477 | 3/2014 |

OTHER PUBLICATIONS

International Preliminary Report on Patentability and Written Opinion dated Mar. 2, 2017 in corresponding International Patent Application No. PCT/EP2015/064389.

Japanese Office Action dated Feb. 28, 2018 in corresponding Japanese Patent Application No. 2017-503564.

Japanese Office Action issued in corresponding Japanese Patent Application No. 2018-203493, dated Nov. 28, 2018.

* cited by examiner

LITHOGRAPHIC APPARATUS AND METHOD

This application is a continuation of U.S. patent application Ser. No. 15/502,466 filed on Feb. 7, 2017, now U.S. Pat. No. 9,977,348, which is the U.S. national phase entry of PCT patent application no. PCT/EP2015/064389, which was filed on Jun. 25, 2015, which claims the benefit of priority of European patent application no. 14181162.0, which was filed on Aug. 15, 2014, each of the foregoing applications is incorporated herein in its entirety by reference.

FIELD

The description relates to a lithographic apparatus and a method for measuring a position of a body.

BACKGROUND

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically performed via imaging onto a layer of radiation-sensitive material provided on the substrate. The location on which the radiation beam is incident on the target portion is referred to as the exposure location.

The cross-section of the radiation beam is typically much smaller than the surface of the substrate. So in order to expose all the target portions on the surface of the substrate, the substrate is moved relative to the projection system. The lithographic apparatus has a stage system to move the substrate relative to the projection system. The stage system is able to move the substrate in such a way that the target portions are placed consecutively in the path of the radiation beam.

To place each of the target portions in the path of the radiation beam correctly, the lithographic apparatus is provided with a position measurement system. The position measurement system measures a position of the stage system. The location on the stage system at which the position measurement system determines the position is referred to as the measurement location. Using the position of the measurement location, the exposure location can be estimated.

SUMMARY

There is a trend to improve the accuracy of the position measurement system to improve the accuracy with which the pattern is exposed onto the target portions. Exposing with an improved accuracy improves the quality of the IC's. Ideally, the exposure location is measured directly, but there are many difficulties to overcome to perform such a measurement. Instead, the measurement location is made as close as possible to the exposure location. Examples of putting the measurement location as close as possible to the exposure location are disclosed in US patent application US2011/0164238, US patent application US2013/0183623 and US patent application US2013/0177857. Each of these US patent applications is hereby incorporated by reference. However, since there are many components of the lithographic apparatus near the exposure location, there is little open space around the exposure location. Movement of the stage system causes the air surrounding the stage system to be disturbed. Because of the little open space, the disturbed air cannot easily move away from the exposure location. Since the disturbed air remains near the exposure location, and since the exposure location is close to the measurement location, the disturbed air surrounds the measurement location. The disturbed air surrounding the measurement location causes a change in the refractive index of the air, which deteriorates the accuracy of the position measurement system.

It is an objective of the invention to, for example, improve the accuracy of the position measurement system.

In an embodiment of the invention, there is provided a lithographic apparatus. The lithographic apparatus comprises an optical sensor, a movable body, a support, a deflector system, a first drive system and a second drive system. The movable body is moveable relative to the sensor. The support is for holding the sensor. The first drive system is arranged to move the movable body relative to the sensor. The second drive system is arranged to move the first drive system relative to the sensor. The second drive system is arranged to move the deflector system relative to the sensor. A disturbance is induced by a movement of the movable body. The deflector system is arranged to create a deflecting area for reflecting the disturbance away from the support.

In a further embodiment of the invention, there is provided a method for measuring a position of a body, the method comprising:
  moving a body relative to a sensor in a first direction;
  moving a body relative to a sensor in a second direction;
  inducing a disturbance by moving the body;
  moving a deflector system relative to the sensor in the second direction, wherein the deflector system is arranged to create a deflecting area for reflecting the disturbance away from the sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
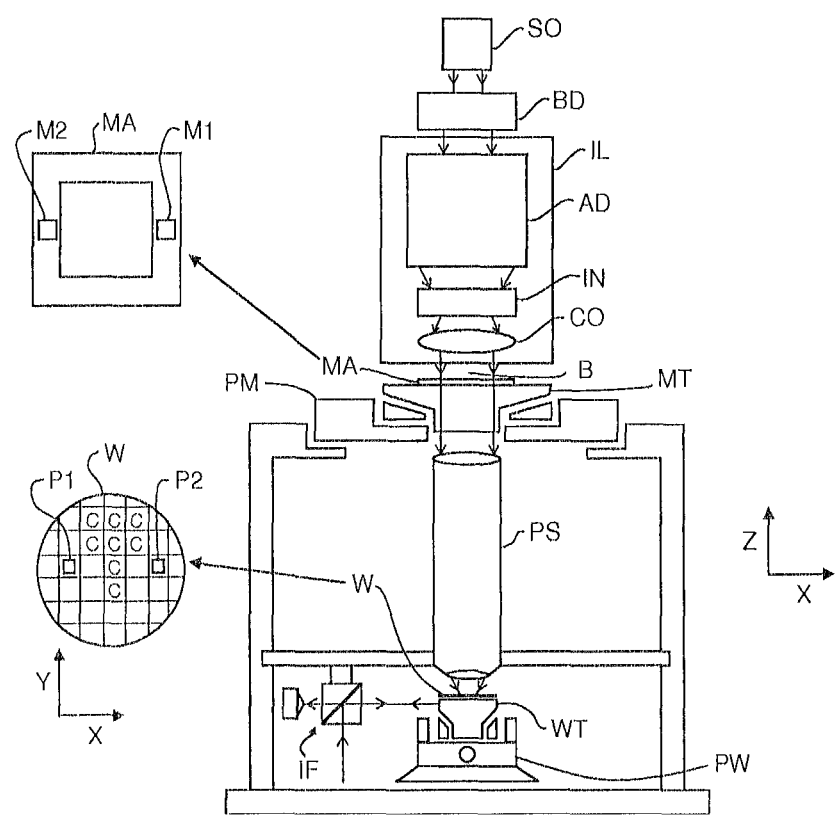
FIG. 1 depicts a lithographic apparatus according to an embodiment of the invention.

FIG. 1 schematically depicts a lithographic apparatus with a position measurement system according to the an embodiment of the invention. The apparatus may comprise an illumination system IL, a support structure MT, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system IL may be used to condition the radiation beam B, to have a desired uniformity and intensity distribution in its cross section.

The term "radiation beam B" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure (e.g. a mask table) MT is for supporting a patterning device (e.g. a mask or reticle) MA. The support structure MT is connected to a first positioning system PM configured to accurately position the patterning device MA in accordance with certain parameters.

The support structure MT supports, i.e. bears the weight of the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device MA" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be trans missive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the apparatus is of a trans missive type, which employs a trans missive mask.

The substrate table WT, e.g. a wafer table, is for holding a substrate W, e.g. a resist coated wafer. The substrate table WT is connected to a second positioning system PW configured to accurately position the substrate W in accordance with certain parameters.

The projection system PS is configured to project a pattern imparted to the radiation beam B by patterning device MA onto a target portion C of the substrate W.

The term "projection system PS" used herein should be broadly interpreted as encompassing any type of projection system PS, including refractive, reflective, magnetic, electromagnetic and electrostatic optical systems, or any combination thereof, as appropriate for the exposure radiation being used, or for other factors such as the use of an immersion liquid or the use of a vacuum.

The radiation beam B is incident on the patterning device MA and is patterned by the patterning device MA. Having traversed the patterning device MA, the radiation beam B passes through the projection system PS which focuses the radiation beam B onto a target portion C of the substrate W. The location on the substrate W on which the radiation beam B is focused is referred to as the exposure location. With the aid of the second positioning system PW and position sensor IF (e.g. an interferometric device, encoder or capacitive sensor), the substrate table WT can be moved accurately, e.g., so as to position different target portions C in the path of the radiation beam B. Similarly, the first positioning system PM and another position sensor (which is not depicted in FIG. 1) can be used to accurately position the patterning device MA with respect to the path of the radiation beam B. In general, movement of the support structure MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The lithographic apparatus may be of a type having two or more substrate tables WT and/or two or more support structures MT. In addition to the at least one substrate table WT, the lithographic apparatus may comprise a measurement table, which is arranged to perform measurements but is not arranged to hold a substrate W.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes:

In the first mode, the so-called step mode, the support structure MT and the substrate table WT are kept essentially stationary, while an entire pattern imparted to the radiation beam B is projected onto a target portion C at one time. The substrate table WT is then shifted in the X and/or Y direction by the second positioning system PW so that a different target portion C can be exposed.

In the second mode, the so-called scan mode, the support structure MT and the substrate table WT are scanned synchronously while a pattern imparted to the radiation beam B is projected onto a target portion C. The velocity and direction of the substrate table WT relative to the support structure MT may be determined by the (de-magnification and image reversal characteristics of the projection system PS.

In the third mode, the support structure MT is kept essentially stationary holding a programmable patterning device MA. The substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Figure 2:
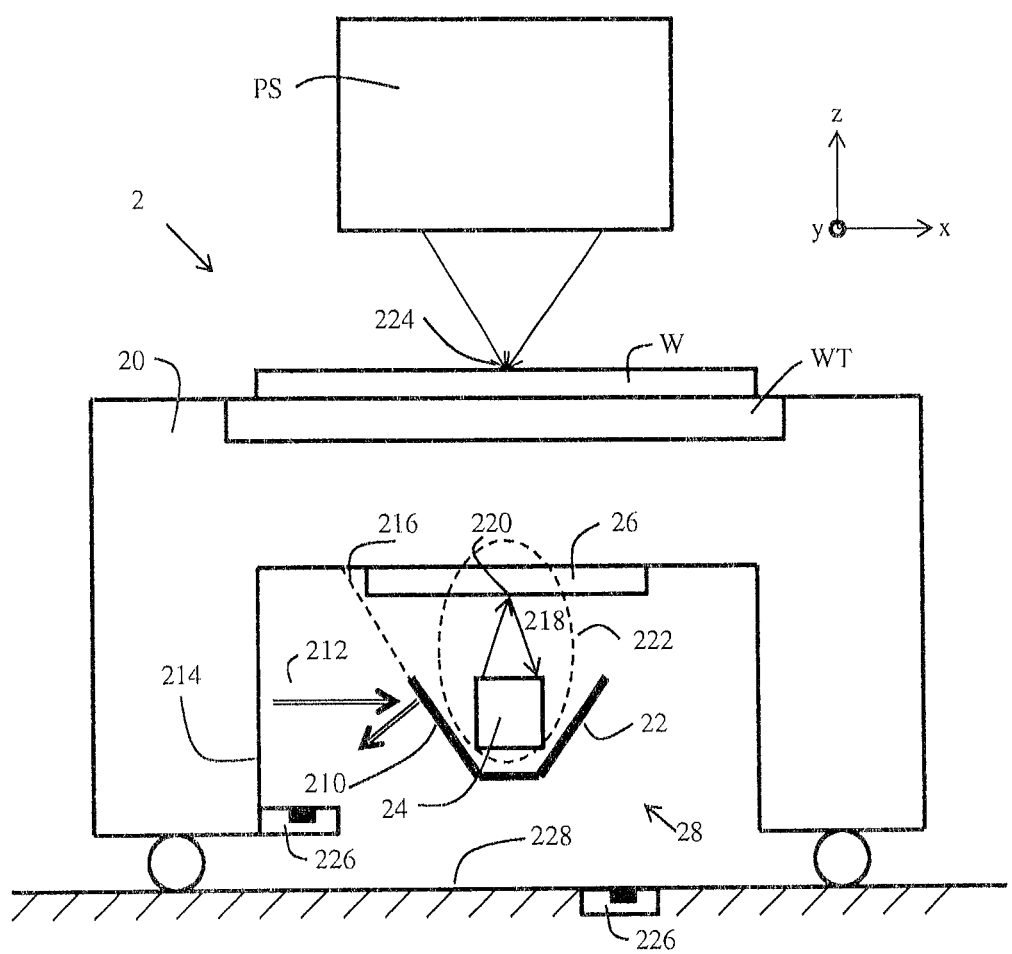
FIG. 2 depicts a stage system according to an embodiment of the invention.

FIG. 2 depicts a stage system 2 according to an embodiment of the invention. The stage system 2 comprises a body 20, a deflector system 22, an encoder head 24 and a diffraction grating 26. The body has a cavity 28. The body 20 is moveable relative to the encoder head 24. The encoder head 24 faces the diffraction grating 26 that is connected to the body 20. The cavity 28 encompasses the encoder head 24 and the diffraction grating 26, which means that the encoder head 24 and the diffraction grating 26 are located inside the cavity 28. The cavity 28 comprises a gas, for example ambient air or any type of gas that fills the cavity 28. The gas in the cavity 28 may be in communication with the ambient air, for example through a large opening of the cavity 28. The gas in the cavity 28 may be in communication with the ambient air through a narrow opening, for example between the body 20 and the base frame 228.

The body 20 comprises the substrate table WT to hold the substrate W. The body 20 may also comprise the second positioning system PW to move the substrate table WI relative to the projection system PS. Further, FIG. 2 shows the exposure location 224, which is the location on the substrate W at which the radiation beam is incident. Alternatively, the body 20 may comprise the support structure MT, the first positioning system PM or both the support structure MT and the first positioning system PM.

The encoder head 24 is arranged to project a measurement beam 218 onto the diffraction grating 26 at a measurement location 220. From the measurement location 220, the measurement beam 218 is returned to the encoder head 24. Based on the measurement beam 218, the encoder head 24 is arranged to generate a signal representative of a position of the encoder head 24 relative to the diffraction grating 26. FIG. 2 shows a measurement volume 222. The encoder head 24, the measurement location 220 and the measurement beam 218 form the measurement volume 222.

The encoder head 24 may be any type of encoder head. For example, the encoder head 24 may emit or receive multiple measurement beams 218. The encoder head 24 may be arranged to provide a signal representative of a displacement relative to the diffraction grating 26 along a single axis or along multiple axes. The encoder head 24 may be a 1D encoder head, a 2D encoder head or a 3D encoder head. The encoder head 24 may be any type of optical sensor. The encoder head 24 may be a combination of an encoder head and a different type of sensor. Such different type of sensor may be any type of sensor other than an encoder head, such as an interferometer or a capacitive sensor or an inductive sensor.

When the body 20 moves, for example, in the x-direction, wall 214 pushes against the gas in the cavity 28. Wall 214 is a wall that at least partially defines the cavity 28. When the wall 214 pushes against the gas, a disturbance 212 is created. The disturbance 212 is initially directed toward the measurement volume 222. The deflector system 22 is arranged to deflect the disturbance 212 away from the diffraction grating 26 before the disturbance 212 reaches the measurement volume 222. In this embodiment, the deflector system 22 has a deflecting area 210 formed by a surface. The surface is at an angle 216 with the diffraction grating 26. By selecting a proper angle 216, the deflector system 22 can be arranged to deflect the disturbance 212 into a desired direction away from the diffraction grating 26. By selecting the angle 216 to be different than 90 degrees, the deflecting area 210 is oblique relative to the diffraction grating 26.

The cavity 28 may be defined by the wall 214 and the diffraction grating 26. The diffraction grating 26 may be in a plane. The wall 214 may extend in a direction out of the plane. In the embodiment of FIG. 2, the cavity 28 is open along the y-direction and has a U-shape. Alternatively, the cavity 28 may be closed along the y-direction. The cavity 28 may be defined by multiple bodies that together form the body 20. The multiple bodies may be moveable relative to each other. For example, wall 214 may be moveable relative to the diffraction grating 26. The cavity 28 may be partly defined by an actuator or a part of an actuator such as a coil or a magnet.

The surface that forms the deflecting area 210 may be curved to deflect the disturbance 212 in a desired direction away from the diffraction grating 26. In addition or alternatively, wall 214 may be curved to direct the disturbance 212 downward and away from the diffraction grating 26.

FIG. 2 depicts an extractor 226 in the cavity 28. The extractor 226 is arranged to extract the disturbance 212 from the cavity 28 after the disturbance 212 is deflected by the deflector system 22. For example, the extractor 226 is a nozzle connected to a low-pressure source, such as a vacuum source. The extractor 226 sucks in gas from the cavity 28, including the disturbance 212. As shown in FIG. 2, the extractor 226 may be located on the body 20, for example in the wall 214. In addition or alternatively, the extractor 226 may be in a base frame 228. The base frame 228 supports the body 20. Preferably, the encoder head 24 is located between the diffraction grating 26 and the extractor 226, because when at this location, the extractor 226 does not attract the disturbance 212 towards the measurement volume 222.

Figure 3:
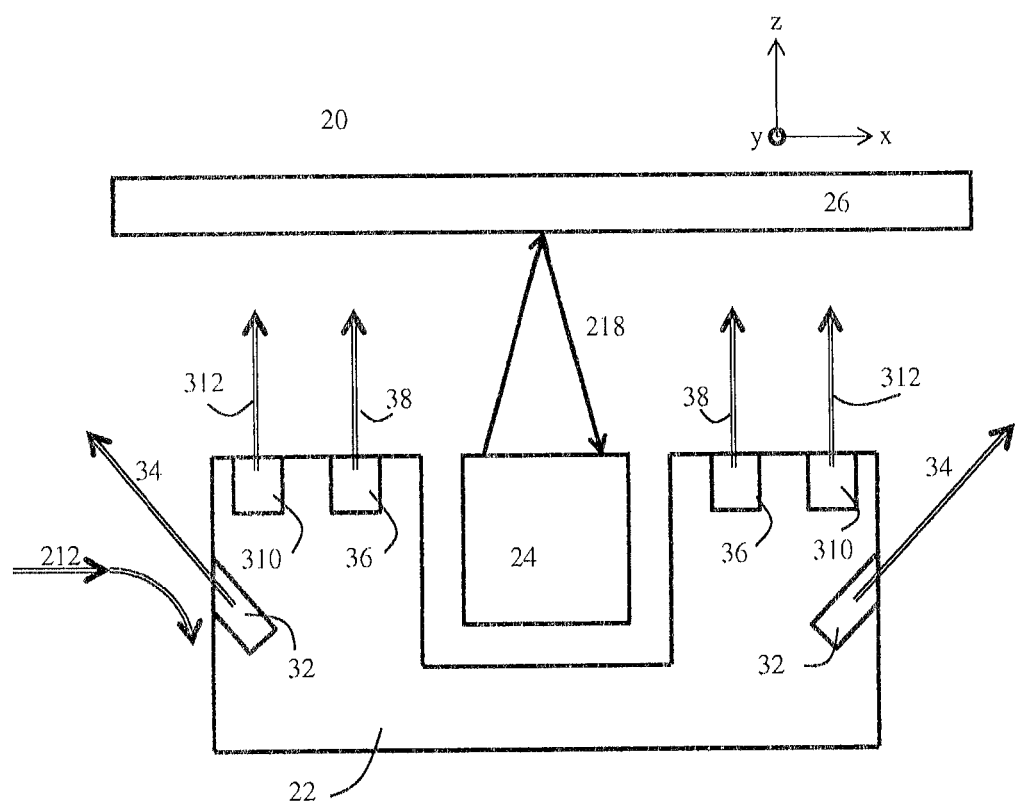
FIG. 3 depicts a deflector system according to an embodiment of the invention.

FIG. 3 depicts a deflector system 22 according to further embodiment of the invention. The deflector system has a first nozzle 32, a second nozzle 36 and a third nozzle 310. The first nozzle 32 is arranged to provide a deflecting gas flow 34 towards the diffraction grating 26. The first nozzle 32 is arranged in such a way that the first nozzle 32 provides the deflecting gas flow 34 at the angle 216 relative to the diffraction grating 26. Since the angle 216 is different from 90 degrees, the deflecting gas flow 34 is provided obliquely relative to the diffraction grating 26. Providing the deflecting gas flow 34 obliquely relative to the diffraction grating 26 prevents so-called flapping of the deflecting gas flow 34 when the deflecting gas flow 34 impinges on the diffraction grating 26. Without flapping, the deflecting gas flow 34 remains stable and therefore better suited to deflect the disturbance 212.

Each of the first nozzle 32, the second nozzle 36 and the third nozzle 310 may be implemented as a series of nozzles in a pattern. The pattern is such that the series of nozzles surround the encoder head 24. Each of the first nozzle 32, the second nozzle 36 and the third nozzle 310 may be implemented as a single slit or a plurality of slits surrounding the encoder head 24.

Disturbance 212, for example a flow of air caused by movement of the body 20, is flowing toward the measurement beam 218. When the disturbance 212 reaches the deflecting gas flow 34, the deflecting area 210 created by the deflecting gas flow 34 pushes the disturbance 212 downward and away from the diffraction grating 26. As a result, the disturbance 212 is prevented from reaching the measurement beam 218.

The second nozzle 36 is arranged to provide a purging gas flow 38 toward the diffraction grating 26. The second nozzle 36 may be arranged to provide the purging gas flow 38 substantially perpendicular to the diffraction grating 26. The second nozzle 36 is arranged closer to the encoder head 24 than the first nozzle 32. Since the second nozzle 36 is closer, the purging gas flow 38 is surrounded by the deflecting gas flow 34. The purging gas flow 38 surrounds the measurement beam 218 to prevent ambient air to flow in the path of the measurement beam 218. The purging gas flow 38 may comprise air with a low concentration of particles, air with a low humidity for example with a humidity lower than that of the ambient air, or any other gas suitable for purging such as nitrogen. Suitable gasses may have a low refractive index, because the refractive index of such gasses is less temperature dependent. Suitable gasses may have the same properties, such as temperature, humidity and composition, as the gas in the cavity 28.

The third nozzle 310 is arranged to provide a further purging gas flow 312 toward the diffraction grating 26. The third nozzle 310 may be arranged to provide the further purging gas flow 312 substantially perpendicular to the diffraction grating 26. The third nozzle 310 is arranged closer to the encoder head 24 than the first nozzle 32. The third nozzle 310 is arranged farther away from the encoder head 24 than the second nozzle 36. Since the second nozzle 36 is closer to the encoder head 24 than the third nozzle 310, the purging gas flow 38 is surrounded by the further purging gas flow 310. The further purging gas flow 310 is surrounded by the deflecting gas flow 34. The second nozzle 36 may be arranged to provide the purging gas flow 38 at a higher velocity than the third nozzle 310 may provide the further purging gas flow 312. For example, the dimensions of the second nozzle 36 and the third nozzle 310 are different to achieve this difference in velocity. In another example, pressure with which the purging gas flow 38 is provided at the second nozzle 36 is higher than the pressure with which the further purging gas flow 312 is provided at the third nozzle 310.

The lithographic apparatus may have a sensor and a controller. The sensor is arranged to provide a sensor signal indicative of a property of the gas in the cavity 28. The sensor may be a temperature sensor or a humidity sensor or a pressure sensor. The sensor may be located in the cavity 28 or at another location as long as the sensor can provide the sensor signal indicative of the property of the gas in the cavity 28. Under control of the sensor signal, the controller is able to change the property of at least one of the deflecting gas flow 34, the purging gas flow 38 and the further purging gas flow 312. For example, the controller can control a valve. The valve connects the first nozzle with multiple supply channels. The value of a property of the gas in each of the supply channels is different. For example, the temperature of the gas in one supply channel is higher than the temperature of the gas in another supply channel. The controller can control the temperature of the deflecting gas flow from the first nozzle 32 by changing the setting of the valve, which causes the two gasses with different temperatures to mix. Alternatively, or in addition, the controller controls a valve that connects the second nozzle with multiple supply channels. Alternatively, or in addition, the controller controls a valve that connects the third nozzle with multiple supply channels.

The deflector system 22 may be integrated with the encoder head 24. Alternatively, the deflector system 22 may be integrated with a structure that supports the encoder head 24.

Figure 4:
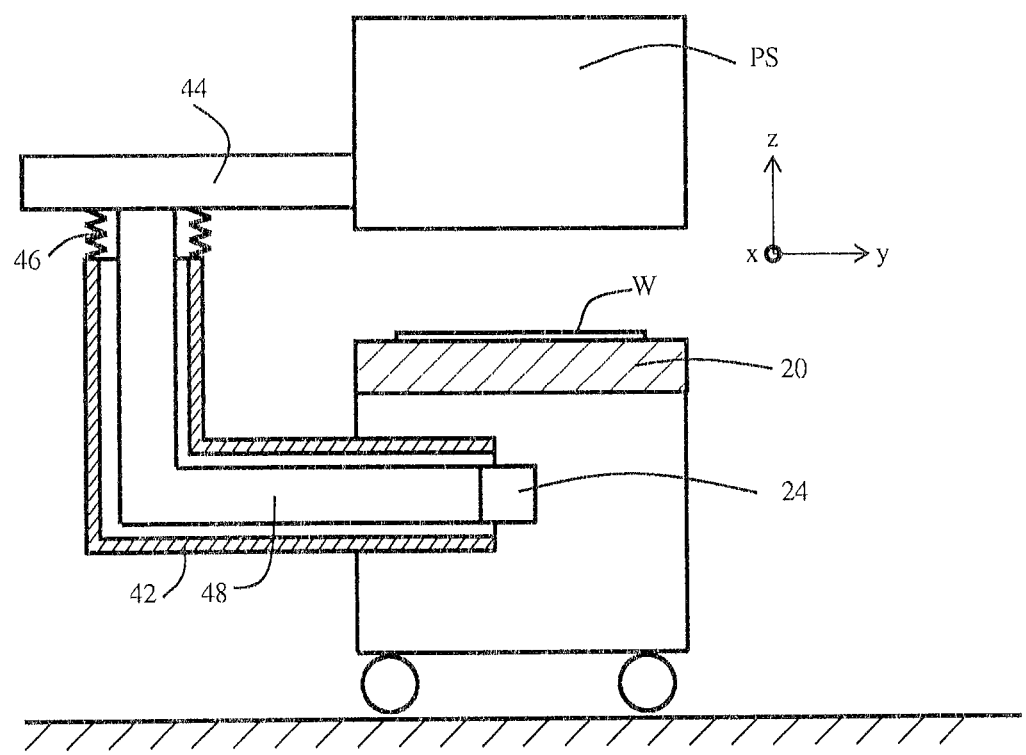
FIG. 4 depicts a deflector system according to a further embodiment of the invention.

FIG. 4 shows the deflector system 22 comprising a shield 42. The shield 42 has a surface to create the deflecting area 210. The shield 42 at least partly surrounds the encoder head 24. For example, the shield 42 may have a recess to accommodate the encoder head 24. A surface of the encoder head 24 facing the diffraction grating 26 may be substantially in the same plane as a surface of the shield 42 facing the diffraction grating 26. Alternatively, the surface of the shield 42 facing the diffraction grating 26 is closer to the diffraction grating 26 than the encoder head 24.

The shield 42 is supported by a frame 44 via an isolator 46. The frame 44 may support the projection system PS. Alternatively or in addition, the frame 44 may support measurement equipment to perform a measurement on the substrate W.

The shield 42 may be provided with a damping material for damping the disturbance 212. For example, the damping material comprises a porous material. The damping material may be a material that is provided with an uneven surface, a rough surface or with holes, such as a perforated plate, or any combination thereof.

The deflector system 22 described in the embodiments above may completely surround the encoder head 24, except for the part of the encoder head 24 that faces the diffraction grating 26. Alternatively, the deflector system 22 surrounds only part of the encoder head 24, for example only a side of the encoder head 24 that is most affected by the disturbance 212. The deflector system 22 may also surround part of the support 48 that supports the encoder head 24, as is shown in FIG. 4. In FIG. 4, the support 48 connects the encoder head 24 to the frame 44. The deflector system 22 prevents the disturbance 212 from reaching the support 48. If the disturbance 212 would reach the support 48, the disturbance 212 could cause the support 48 to vibrate and, as a result, cause the encoder head 24 to vibrate.

Figure 5A:
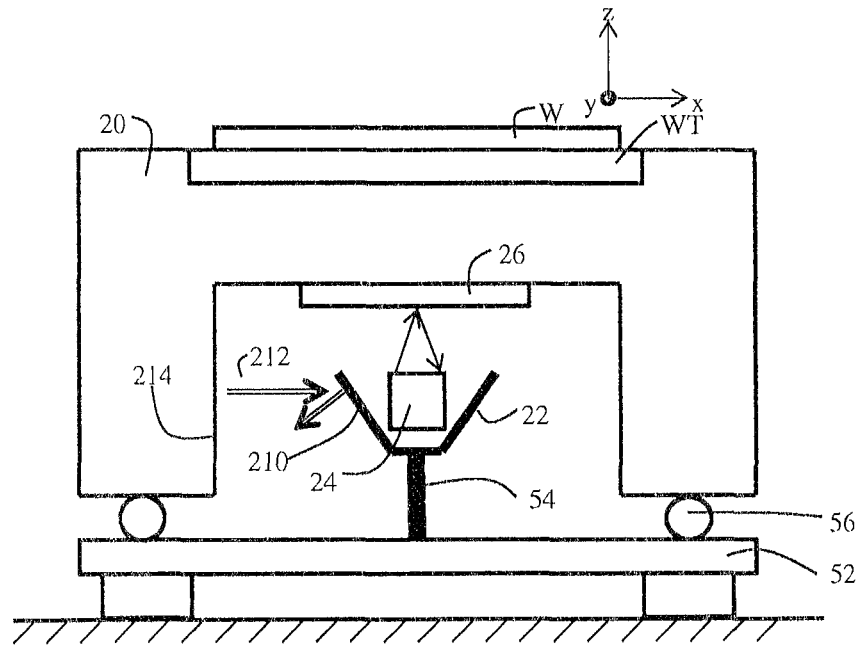
FIGS. 5A and 5B depict a deflector system according to yet a further embodiment of the invention.
Figure 5B:
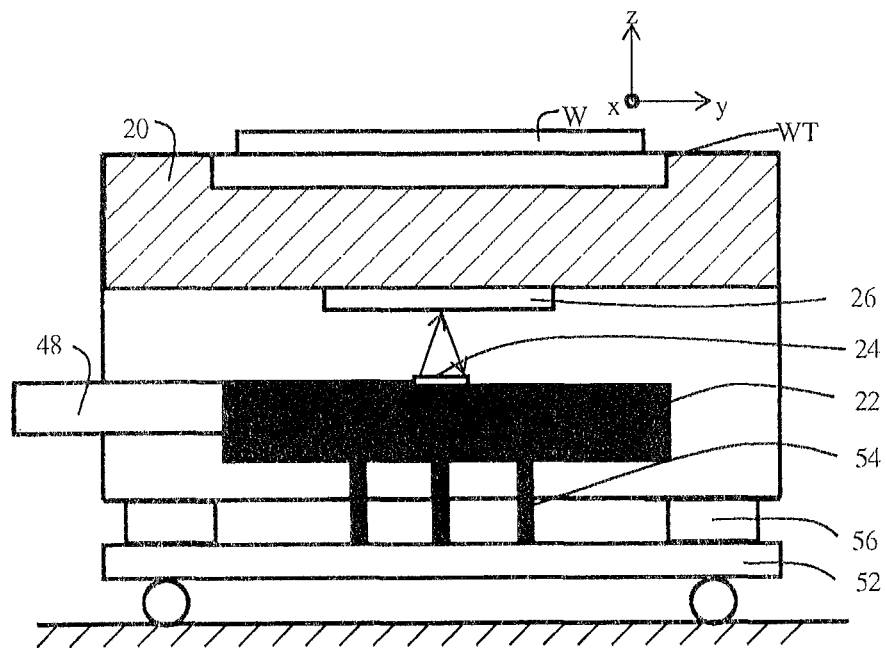

FIGS. 5A and 5B depict the deflector system 22 according to yet a further embodiment of the invention. The embodiment of FIGS. 5A and 5B is the same as the embodiment of FIG. 4, except for what is disclosed below.

FIGS. 5A and 5B disclose a lithographic apparatus comprising the encoder head 24, the body 20, the support 48, the deflector system 22, a drive system 52 and a further drive system 56. The encoder head 24 may be any type of optical sensor. The body 20 is movable relative to the encoder head 24. The support 48 holds the encoder head 24.

The further drive system 56 is arranged to move the body 20 relative to the encoder head 24. The drive system 52 is arranged to drive the further drive system 56 relative to the encoder head 24. The drive system 52 is arranged to move the deflector system 22 relative to the encoder head 24. When the disturbance 212 is induced by a movement of the body 20, the deflector system 22 is arranged to create the deflecting area for reflecting the disturbance away from the support 48.

The deflector system 22 may be mounted to the drive system 52 via an isolator. Alternatively, such an isolator may be omitted, since the performance of the drive system 52 may not be significantly affected by a vibration of the deflector system 22 or vice versa.

The further drive system 56 may be arranged to move the body 20 relative to the encoder head 24 in a first direction, for example in the x-direction. The drive system 52 may be arranged to move the further drive system 56 relative to the encoder head 24 in a second direction, for example the y-direction. The drive system 52 may be arranged to move the deflector system 22 relative to the encoder head 24 in the second direction. The first direction may be different from the second direction. For example, the first direction is perpendicular to the second direction.

The drive system 52 and the further drive system 56 may from part of a stage system. The drive system 52 and the further drive system 56 may be part of the second position system PW. The drive system 52 and the further drive system 56 may be part of the first position system PM. The drive system 52 and the further drive system 56 may be part of the short-stroke module, the long-stroke module, or a combination of the short-stroke module and the long-stroke module.

The support 48 and the deflecting area 210 may be elongated in the y-direction. The body 20 may have a first length along the y-direction. The deflecting area 210 may have a second length along the y-direction. The first length and the second length may be substantially equal to each other.

The support 48 may extend along the y-direction on two sides of the encoder head 24. Extending the support 48 in this way, places the encoder head 24 away from an edge of the support 48. When the encoder head 24 is placed away from an edge of the support 48, the encoder head 24 is less affected by edge vortexes. Edge vortexes may occur at an edge of the support 48 and could have caused the encoder head 24 to vibrate.

In FIGS. 5a and 5b, the encoder head 24 faces a surface of the body 20. The surface of the body 20 is a surface on which the diffraction grating 26 is arranged. The deflecting area 210 is oblique relative to the surface. The body 20 has a first side on which the substrate W is arranged. The diffraction grating 26 is arranged on a second side of the body 20. The second side may be opposite to the first side.

As shown in FIGS. 5a and 5b, the cavity 28 encompasses the diffraction grating 26, the encoder head 24 and a gas. One of more of the extractor 226 may be provided to extract from the cavity 28 at least part of the disturbance deflected from the deflecting area 210.

In case the lithographic apparatus is not provided with the deflector system 22, the support 48 may have an aerodynamic shape. The aerodynamic shape may reduce or prevent the disturbance 212 to create vortex shedding. Vortex shedding is an unsteady phenomenon that can cause the support 48 to vibrate. In addition, vortex shedding may negatively affect the measurement beam 218. The aerodynamic shape of the support 48 may be applied in combination with the embodiments described above having the deflector system 22. For example, the aerodynamic shape may be applied to a part of the support 48 that is sensitive to the disturbance 212, such as a part of the support 48 that is not surrounded by the shield 48.

The wall 214 may be provided with holes to minimize the creation of the disturbance 212. The holes reduce the surface of the wall 214 that creates the disturbance 212. Further, the holes allow gas inside the cavity 28 to flow out of the cavity 28, which reduces the disturbance 212.

The support 48 may be elongated in the y-direction as shown in FIG. 4. At the end of the support 48, the encoder head 24 is mounted. In an embodiment, support 48 is extended beyond the location at which the support 48 holds the encoder head 24. This extension may be for example about 1 cm or more. The extension helps to prevent edge vortexes near the encoder head 24. Edge vortexes occur when the disturbance 212 moves along the edge of the support 48. By placing the edge of the support 48 at some distance away from the encoder head 24, the influence of the edge vortexes on the encoder head 24 is reduced.

Figure 6:
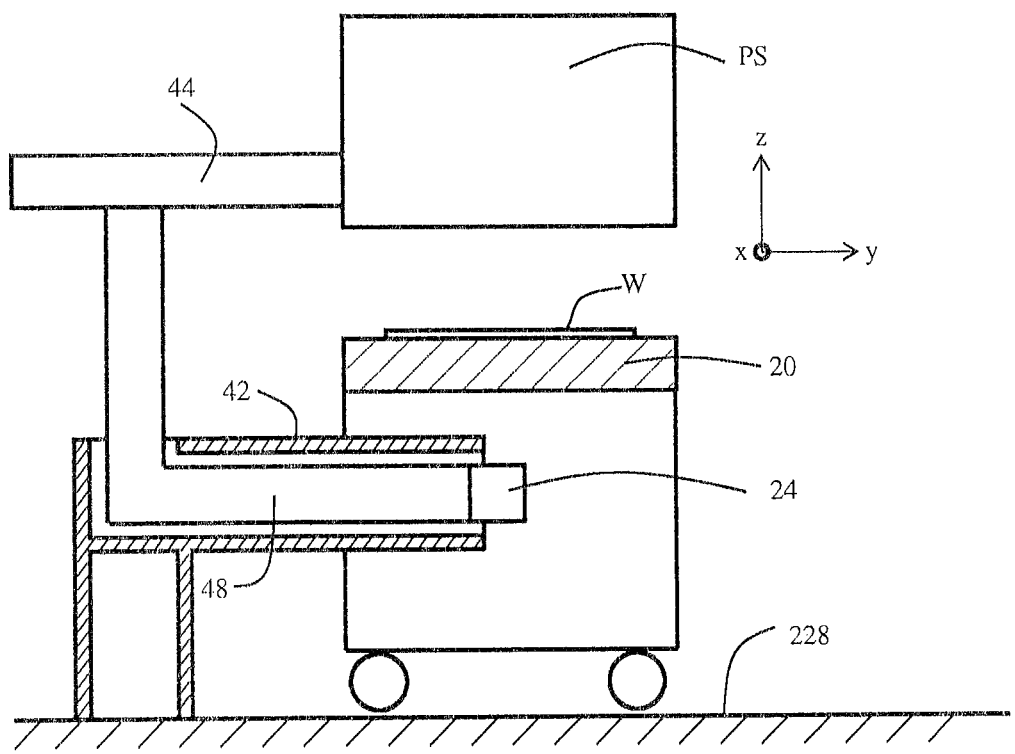
FIG. 6 depicts a deflector system according to another embodiment of the invention.

FIG. 6 depicts an embodiment of the invention. The embodiment of FIG. 6 is similar to the embodiments of FIGS. 4 and 5 except for what is stated below. In the embodiment of FIG. 6, the shield 42 is connected to the base frame 228 rather than to the frame 44. The shield 42 may be connected to the base frame 228 without the use of the isolator 44, since the base frame 228 may not be significantly affected by vibrations of the shield 42. The base frame 228 may support the frame 44, for example via an isolator.

In an embodiment of the invention, there is provided a lithographic apparatus comprising a body, a deflector system, an encoder head and a diffraction grating. The body is moveable relative to the encoder head. The encoder head is arranged to receive a measurement beam from a measurement location on the diffraction grating. The encoder head, the measurement beam and the measurement location form a measurement volume. The diffraction grating is attached to the body. The body has a cavity encompassing the diffraction grating, the encoder head and a gas. The deflector system is arranged to create a deflecting area for deflecting a disturbance of the gas away from the measurement volume.

According to the embodiment of the invention, the deflector system deflects the disturbance away from the measurement volume. Since the disturbance is deflected away from the measurement volume, the disturbance has less influence on the position measurement by the encoder head. As a result, the disturbance may cause less vibration of the encoder head or may cause less variation in the air through which the measurement beam travels between the encoder head and the diffraction grating. This result improves the accuracy of the position measurement.

In an embodiment, the disturbance is induced by a movement of the body.

According to the embodiment, the deflector system is especially beneficial in case the disturbance is induced by a movement of the body. When moving the body, it is more likely that a gradient in the gas moves toward the measurement volume. Such a gradient may be a change in temperature or humidity or composition of the gas. Further, movement of the body may cause pressure waves that may cause the encoder head to vibrate.

In an embodiment, the cavity is defined by at least the diffraction grating and a wall of the body. The grating is parallel to a plane. The wall extends in a direction out of the plane. The movement is for changing a distance between the wall and the encoder head.

According to the embodiment, the body is moveable such that the wall moves closer to or further away from the encoder head. When the wall moves relative to the encoder head, the wall creates an air disturbance that propagates in the direction of the encoder head. The deflector system is able to deflect the air disturbance away from the diffraction grating, so the effect of the air disturbance on the position measurement is reduced.

In an embodiment, the deflecting area is oblique relative to the diffraction grating.

According to the embodiment, the deflecting area is more effective in deflecting the disturbance away from the measurement volume.

In an embodiment, the deflector system comprises a first nozzle arranged to provide toward the diffraction grating a deflecting gas flow obliquely relative to the diffraction grating. The deflecting gas flow is arranged to create the deflecting area. The deflecting gas flow at least partly surrounds the measurement beam.

According to the embodiment, the deflecting area is created by the deflecting gas flow. A disturbance, such as a disturbing gas flow moving toward the measurement volume, is pushed away from the diffraction grating by the deflecting gas flow. Since the deflecting gas flow surrounds the measurement beam, the disturbing gas flow is deflected before the disturbing gas flow is able to reach the measurement beam and disturbs the position measurement of the encoder head.

In an embodiment, the deflector system comprises a second nozzle arranged to provide toward the diffraction grating a purging gas flow. The second nozzle is arranged to provide the purging gas flow substantially surrounding the measurement beam.

According to the embodiment, a purging gas flow substantially surrounds the measurement beam. The purging gas may have properties, such as composition and humidity, to provide an optimal medium for the measurement beam to propagate.

In an embodiment, the deflector system comprises a third nozzle arrange to provide toward the diffraction grating a further purging gas flow. The second nozzle and the third nozzle are arranged relative to each other such that the purging gas flow is at least partly surrounded by the further purging gas flow.

According to the embodiment, the third nozzle provides a further purging gas flow that surrounds the purging gas flow. The further purging gas flow provides an additional layer of protection between the measurement beam and the ambient air. The further purging gas flow helps to prevent ambient air from reaching the measurement beam.

In an embodiment, the second nozzle and the third nozzle are arranged to provide the purging gas flow at a higher velocity than a velocity of the further purging gas flow.

According to the embodiment, the purging gas flow is provided at a higher velocity than the velocity with which the further purging gas flow is provided. The high velocity of the purging gas flow helps to prevent a temperature gradient to occur along the path of the measurement beam. A temperature gradient would reduce the measurement accuracy of the encoder head. The low velocity of the further purging flow helps to prevent the further purging flow from becoming a turbulent flow. A turbulent flow would cause mixing of the further purging flow and the ambient air. With the low velocity, mixing with the ambient air is reduced and thus, the measurement beam is better shielded from the ambient air. Since both the purging gas flow and the further purging gas flow are conditioned gas flows, mixing of the purging gas flow and the further purging gas flow does not negatively affect the measurement beam.

In an embodiment, the lithographic apparatus comprises a sensor and a controller. The sensor is arranged to provide a sensor signal indicative of a property of the gas. The controller is arranged to change the property of at least one of the deflecting gas flow, the purging gas flow and the further purging gas flow under control of the sensor signal.

According to the embodiment, a property of the deflecting gas flow, the purging gas flow and/or the further purging gas flow can be adjusted. Such a property may be temperature, humidity or composition. The property may be changed in a controlled way by the controller, such that the property of the deflecting gas flow, the purging gas flow and/or the further purging gas flow matches with the property of the gas. When matching, the effect of gas leaking into the measurement volume on the measurement beam is minimized.

In an embodiment, the deflector system comprises a deflecting surface arranged obliquely relative to the diffraction grating. The deflecting surface is arranged to create the deflecting area.

According to the embodiment, the deflecting area is on the deflecting surface. The deflecting surface is a passive element that does not need to be provided with a gas or power.

In an embodiment, the deflecting surface is curved.

According to the embodiment, providing a curved deflecting surface may improve the efficiency with which the deflecting surface is able to deflect the disturbance away from the diffraction grating.

In an embodiment, the deflector system comprises a shield having the deflecting surface. The shield at least partly surrounds the encoder head. The shield is substantially dynamically isolated from the encoder head.

According to the embodiment, a disturbance impinges on the shield. The disturbance may be a shock wave of air or an air flow. Since the shield has the deflecting surface, the shield is able to deflect the disturbance away from the diffraction grating. The impingement of the disturbance may cause the shield to vibrate. However, since the shield is dynamically isolated from the encoder head, a vibration of the shield does not propagate to the encoder head. The position of the encoder head is affected less by the disturbance and thus the accuracy of the position measurement is improved.

In an embodiment, the lithographic apparatus comprises a projection system for projecting a patterned projection beam onto a substrate. The lithographic apparatus comprises a drive system arranged to drive the body relative to the projection system. The drive system supports the shield, so as to drive the shield relative to the projection system.

According to the embodiment, the shield is connected to the drive system. As a result, the shield does not have to be connected to any stationary part of the lithographic apparatus. This means that there does not need to be an opening in the body or in the drive system for the shield to reach the stationary part. By omitting such an opening, the shape of the body and the drive system may be dynamically optimized, which improves the accuracy with which the body can be moved.

In an embodiment, the lithographic apparatus comprises a frame and an isolator. The frame is arranged for supporting the shield. The isolator is arranged to couple the shield and the frame to each other so as to isolate a vibration of the shield from the frame.

According to the embodiment, the shield is connected to a frame via an isolator. When the disturbance causes the shield to vibrate, the vibration is prevented from propagating to the frame by the isolator. As a result, the frame and any other components connected to the frame are not significantly affected by the vibration.

In an embodiment, the frame is arranged to support the projection system.

According to the fifteenth embodiment, the frame is arranged to support the projection system. Since the frame is isolated from a vibration of the shield, the projection system is not significantly affected by the vibration. Preventing the projection system from vibrating improves the quality with which the pattern is exposed on a target portion.

In an embodiment, the deflecting surface comprises a damping material for damping the disturbance.

According to the embodiment, the damping material on the deflecting surface is able to dampen at least part of the disturbance. By damping the disturbance, the effect of the disturbance on other parts of the lithographic apparatus is reduced.

In the embodiment, the body has a first side and a second side. The body is arranged to support a substrate on the first side. The diffraction grating is arranged on the second side. The first side and the second side are opposite to each other.

According to the embodiment, the diffraction grating can be placed closely to the substrate. Having the diffraction grating close to the side of the body that holds the substrate improves the correlation between the measurement location and the exposure location.

In an embodiment, the lithographic apparatus comprises an extractor arranged to extract from the cavity at least part of the disturbance deflected from the deflection area.

According to the embodiment, the extractor is able to extract the disturbance, such as an air flow, out of the cavity. As a result, the chance that the disturbance in the cavity is reflected back to the measurement volume is reduced.

In an embodiment, there is provided a method for measuring a position of a body, the method comprising: measuring a position of the body using a diffraction grating in a cavity of the body by providing a measurement beam onto a measurement location on the diffraction grating; creating a disturbance of a gas in the cavity by moving the body; deflecting the disturbance away from at least one of the measurement beam and the measurement location.

According to the embodiment, the disturbance is deflected away from at least one of the measurement beam and the measurement location. Since the disturbance is deflected away from at least one of the measurement beam and the measurement location, the disturbance has less influence on the position measurement. This improves the accuracy of the position measurement.

In an embodiment, the method comprises providing a deflecting gas flow obliquely toward the diffraction grating, the deflecting gas flow at least partly surrounding the measurement beam; creating a deflecting area with the deflecting gas flow; deflecting the disturbance with the deflecting area away from at least one of the measurement beam and the measurement location.

According to the embodiment, a disturbance, such as a disturbing gas flow moving toward the measurement volume, is pushed away from the measurement beam and/or measurement location by the deflecting gas flow. Since the deflecting gas flow surrounds the measurement beam, the disturbing gas flow is deflected before the disturbing gas flow is able to reach the measurement beam and to disturb the position measurement.

In an embodiment, the method comprises providing a purging gas flow to the diffraction grating; at least partly surrounding the measurement beam with the purging gas flow.

According to the embodiment, a purging gas flow substantially surrounds the measurement beam. The purging gas may have properties, such as composition and humidity, to provide an optimal medium for the measurement beam to propagate.

In an embodiment, the method comprises providing a further purging gas flow to the diffraction grating at a lower velocity than a velocity of the purging gas flow; at least partly surrounding the purging gas flow with the further purging gas flow.

According to the embodiment, the further purging gas flow provides an additional layer of protection between the measurement beam and the ambient air. The high velocity of the purging gas flow helps to prevent a temperature gradient to occur along the path of the measurement beam. The low velocity of the further purging flow helps to prevent turbulent flow of the further purging flow. A turbulent flow would cause mixing of the further purging flow and the ambient air. With the low velocity, mixing is reduced and thus, the measurement beam is better shielded from the ambient air.

In an embodiment, the method comprises extracting from the cavity at least part of the disturbance deflected from the deflection area.

According to the embodiment, extracting the disturbance from the cavity decreases the chance that the disturbance in the cavity is reflected back to the measurement beam.

In an embodiment, there is provided a lithographic apparatus, comprising: an optical sensor (24); a movable body (20) moveable relative to the sensor (24); a support (48) for holding the sensor (24); a deflector system (22); a first drive system (56); a second drive system (52); wherein the first drive system (56) is arranged to move the movable body (20) relative to the sensor (24), wherein the second drive system (52) is arranged to move the first drive system (56) relative to the sensor (24), wherein the second drive system (52) is arranged to move the deflector system (22) relative to the sensor (24), wherein a disturbance is induced by a movement of the movable body (20), wherein the deflector system (22) is arranged to create a deflecting area (210) for reflecting the disturbance away from the support (48).

In an embodiment, the first drive system (56) is arranged to move the movable body (20) relative to the sensor (24) in a first direction (x), wherein the second drive system (52) is arranged to move the first drive system (56) relative to the sensor (24) in a second direction (y), wherein the second drive system (52) is arranged to move the deflector system (22) relative to the sensor (24) in the second direction (y), wherein the first direction (x) is different from the second direction (y). In an embodiment, the support (48) and the deflecting area (210) are elongated in the second direction (y). In an embodiment, the movable body (20) has a first length along the second direction (y), wherein the deflecting area (210) has a second length along the second direction (y), wherein the first length and the second length are substantially equal to each other. In an embodiment, the support (48) extends along the second direction (y) on two sides of the sensor (24). In an embodiment, the sensor (24) faces a surface of the movable body (20), wherein the deflecting area (210) is oblique relative to the surface. In an embodiment, the deflector system (22) comprises a first nozzle (32) arranged to provide toward the surface a deflecting gas flow (34) obliquely relative to the surface, wherein the deflecting gas flow (34) is arranged to create the deflecting area (210). In an embodiment, the sensor (24) is arranged to receive a measurement beam (218) from the surface, wherein the deflector system (22) comprises a second nozzle (36) arranged to provide toward the surface a purging gas flow (38), wherein the second nozzle (36) is arranged to provide the purging gas flow (38) substantially surrounding the measurement beam (218). In an embodiment, the deflector system (22) comprises a third nozzle (310) arranged to provide toward the surface a further purging gas flow (312), wherein the second nozzle (36) and the third nozzle (310) are arranged relative to each other such that the purging gas flow (38) is at least partly surrounded by the further purging gas flow (312). In an embodiment, the second nozzle (36) and the third nozzle (310) are arranged to provide the purging gas flow (38) at a higher velocity than velocity of the further purging gas flow (312). In an embodiment, the deflector system (22) comprises a deflecting surface arranged obliquely relative to the surface, and the deflecting surface is arranged to create the deflecting area (210). In an embodiment, the deflecting surface is curved. In an embodiment, the deflecting surface comprises damping material. In an embodiment, the movable body (20) has a first side and a second side, wherein the movable body (20) is arranged to support a substrate (W) on the first side, wherein the surface is on the second side, and wherein the first side and the second side are opposite to each other. In an embodiment, the lithographic apparatus comprises a diffraction grating (26) arranged on the surface, wherein the body has a cavity (28) encompassing the diffraction grating (26), the optical sensor (24) and a gas, wherein the lithographic apparatus further comprises an extractor (226) arranged to extract from the cavity (28) at least part of the disturbance deflected from the deflecting area (210).

In an embodiment, there is provided a method for measuring a position of a body, the method comprising: moving a body (20) relative to an optical sensor (24) in a first direction (x); moving a body (20) relative to an optical sensor (24) in a second direction (y); inducing a disturbance by moving the body (20); and moving a deflector system (22) relative to the optical sensor (24) in the second direction (y), wherein the deflector system (22) is arranged to create a deflecting (210) for reflecting the disturbance away from the optical sensor (24).

Although specific reference may be made in this text to the use of a lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The substrate W may be processed, before or after the transfer of the pattern onto the substrate W, in for example a track, a metrology tool and/or an inspection tool. A track is a tool that typically applies a layer of resist to a substrate W and develops the resist that has been exposed to the radiation beam B. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A stage system, comprising:
    a frame;
    an isolator;
    a base frame that supports the frame via the isolator;
    a diffraction grating;
    a body comprising a substrate table to hold a substrate, wherein the body has a first side on which the substrate is arranged,
    wherein the body has a second side opposite to the first side on which the diffraction grating is arranged, and
    wherein the frame is arranged to support measurement equipment to perform a measurement on the substrate other than or in addition to measurement of the diffraction grating.

2. The stage system of claim 1, comprising an encoder head arranged to generate a signal representative of a relative position between the encoder head and the diffraction grating.

3. The stage system of claim 2, comprising a support, wherein the frame supports the encoder head via the support.

4. The stage system of claim 3, wherein the support extends beyond a location at which the support holds the encoder head.

5. The stage system of claim 2, wherein the encoder head is an 1D-encoder head, a 2D-encoder head or a 3D-encoder head.

6. The stage system of claim 2, comprising a shield at least partly surrounding the encoder head, wherein the shield has a recess to accommodate the encoder head.

7. The stage system of claim 6, wherein a surface of the encoder head facing the diffraction grating is substantially in a same plane as a surface of the shield facing the diffraction grating.

8. The stage system of claim 6, comprising a further isolator, wherein the shield is supported by the frame via the further isolator.

9. The stage system of claim 2, wherein the encoder head comprises an interferometer.

10. The stage system of claim 2, comprising a nozzle to provide a gas flow toward the diffraction grating.

11. The stage system of claim 10, comprising a series of nozzles surrounding the encoder head.

12. The stage system of claim 2, comprising a drive system arranged to move the body relative to the encoder head.

13. The stage system of claim 12, comprising a further drive system, wherein the drive system is arranged to move the body relative to the encoder head in a first direction, and wherein the further drive system is arranged to move the drive system relative to the encoder head in a second direction different from the first direction.

14. The stage system of claim 2, having a cavity defined at least in part by a wall and the diffraction grating, wherein the encoder head is located inside the cavity, and wherein the wall is moveable relative to the diffraction grating.

15. A lithographic apparatus comprising the stage system according to claim 1.

16. The lithographic apparatus of claim 15, comprising a projection system arranged to project a pattern onto the substrate, wherein one of the stage systems is arranged to move the substrate, and wherein another of the stage systems is arranged to move a patterning device arranged to provide the pattern.

17. A stage system, comprising:
a body comprising a substrate table to hold a substrate, wherein the body has a first side on which the substrate is arranged and a second side, opposite to the first side, on which a diffraction grating is arranged; and
a frame supported via an isolator on a base frame, the frame supporting measurement equipment configured to measure the diffraction grating and a portion of the measurement equipment is connected to an isolator between the frame and the portion.

18. The stage system of claim 17, wherein the measurement equipment comprises an encoder head arranged to generate a signal representative of a relative position between the encoder head and the diffraction grating.

19. The stage system of claim 18, comprising a shield at least partly surrounding the encoder head, wherein the shield has a recess to accommodate the encoder head.

20. A method comprising:
moving a body comprising a substrate table to hold a substrate, wherein the body has a first side on which the substrate is arranged and a second side, opposite to the first side, on which a diffraction grating is arranged; and
performing a measurement on the substrate other than or in addition to measurement of the diffraction grating, using measurement equipment supported on a frame, wherein the frame is supported on a base frame via an isolator.

21. The method of claim 20, further comprising performing measurement of the diffraction grating using measurement equipment supported by the frame.

22. The method of claim 21, further comprising supporting a portion of measurement equipment used to measure the diffraction grating using an isolator between the frame and the portion.

23. The stage system of claim 17, wherein the frame is further arranged to support measurement equipment to perform a measurement on the substrate other than or in addition to measurement of the diffraction grating.

* * * * *